United States Patent
Nakata

[15] 3,641,403
[45] Feb. 8, 1972

[54] THYRISTOR WITH DEGENERATE SEMICONDUCTIVE REGION

[72] Inventor: Josuke Nakata, Itami, Japan

[73] Assignee: Mitsubishi Denki Kabushiki Kaisha, Tokyo, Japan

[22] Filed: May 25, 1970

[21] Appl. No.: 41,130

[52] U.S. Cl. ....................317/235 R, 317/235 L, 317/235 AA, 317/235 AB, 317/235 AE
[51] Int. Cl. ....................H01l 11/00, H01l 15/00
[58] Field of Search ..........317/234, 235 L, 235 AA, 235 AB, 317/235 AE; 307/305

[56] References Cited

UNITED STATES PATENTS

| | | | |
|---|---|---|---|
| 3,152,928 | 10/1964 | Hubner | 317/235 |
| 3,260,901 | 7/1966 | Luescher et al. | 317/235 |
| 3,284,681 | 11/1966 | Gentry | 317/235 |
| 3,254,234 | 5/1966 | Sziklai et al | 317/234 |
| 3,434,023 | 3/1969 | Lesk | 317/234 |

*Primary Examiner*—John W. Huckert
*Assistant Examiner*—Andrew J. James
*Attorney*—Robert E. Burns and Emmanuel J. Lobato

[57] ABSTRACT

There is disclosed a thyristor provided with junctions formed such that predetermined portions of a cathode emitter junction and the adjacent portions of both regions forming that junction are highly doped to be degenerated thereby to introduce a multiplicity of centers of recombination. The thyristor is free from the disadvantages of the conventional shorted emitter-type thyristors and still retaining their advantages.

6 Claims, 4 Drawing Figures

THYRISTOR WITH DEGENERATE SEMICONDUCTIVE REGION

BACKGROUND OF THE INVENTION

This invention relates to a thyristor and more particularly to an emitter structure therefor.

In the past thyristors widely employed have been of the so-called shorted emitter configuration in which the emitter junction or junctions is or are partly short circuited. The shorted emitter configuration of thyristors is advantageous in that the number of electrons injected is restrained from increasing due to an increase in temperature of the thyristor in its forward blocked state and to an increase in rise rate (*dr/dt*) of the forward applied voltage, and that a decrease in blocking voltage due to an increase in temperature and a reduction in ability to block the voltage due to a high (*dv/dt*) is prevented while the turnoff time can decrease. It is, however, disadvantageous in that the cathode emitter region decreases in area of the junction to increase the density of current flowing through the thyristor while the fired region is obstructed from laterally spreading to permit local heating and possible damage to the thyristor.

SUMMARY OF THE INVENTION

Accordingly, it is an object of the invention to provide a new and improved thyristor substantially free from the disadvantages of the shorted emitter-type thyristors of the conventional construction as above described and still retaining the advantages thereof as above described.

The invention accomplishes this object by the provision of a thyristor device comprising a wafer of semiconductive material including four semiconductive layers of alternate conductivity, a PN-junction formed between the outermost one of the four semiconductive layers providing an emitter region and the adjacent layer providing a base region, and a control electrode disposed on the base region to control the current-to-voltage characteristic of the thyristor device, characterized in that the PN-junction includes partly at least one tunnel effect junction or at least one PN-junction having an impurity concentration of at least $5\times10^{18}$ atoms per cubic centimeter of the semiconductive material on each side thereof.

The base region may preferably have the impurity concentration decreased with an increase in distance from the emitter region adjacent thereto.

A plurality of tunnel effect junctions or the last-mentioned PN-junctions may advantageously be uniformly distributed in spaced relationship on the interface of the emitter and base regions.

BRIEF DESCRIPTION OF THE DRAWING

The invention will become more readily apparent from the following detailed description taken in conjunction with the accompanying drawing in which.

DESCRIPTION OF THE PREFERRED EMBODIMENT

Figures 1, 2A, 2B, 3:
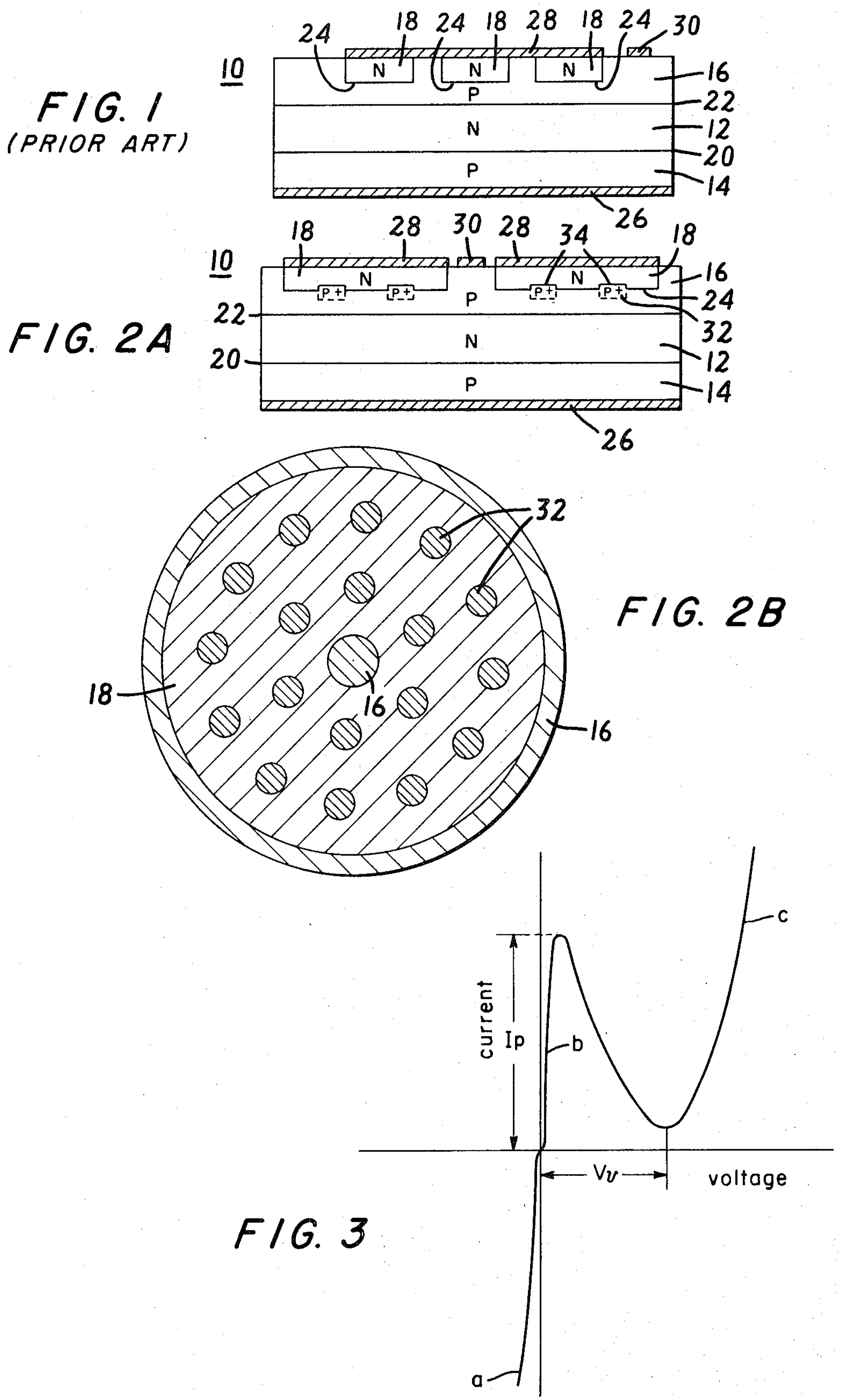
FIG. 1 is a sectional view of a thyristor typically constructed in accordance with the principles of the prior art.
FIGS. 2A and B are respectively a sectional view and a plan view of a thyristor constructed in accordance with the principles of the invention.
FIG. 3 is a graph of the current-to-voltage characteristic of the device shown in FIGS. 2A and B.

Referring now to FIG. 1 there is illustrated a shorted emitter-type thyristor previously employed. A wafer of semiconductive material such as silicon generally designated by the reference numeral 10 includes an intermediate layer 12 having a high resistivity and one conductivity for example, an N-type conductivity, and an outer layer 14 of opposite conductivity, in this example, P-type conductivity disposed on one surface or the lower surface as viewed in FIG. 1 of the intermediate layer 12, another outer layer 16 of opposite conductivity or P-type conductivity disposed on the other or upper surface of the intermediate layer 12, and a plurality of the outermost layers 18 of N-type conductivity disposed in the layer 16 on preselected portions to form a structure of four layers of alternate conductivity. The layers 12 and 16 provide base regions while the layers 14 and 18 provide emitter regions. Formed between the N-type base region 12 and the P-type emitter region 14, between the N-type base region 12 and the P-type emitter region 16 and between the P-type base region 16 and the N-type emitter regions 18 are an anode emitter junction 20, a forward blocking junction 22 and cathode emitter junctions 24 respectively.

Then an anode electrode 26 is disposed in ohmic contact with the exposed surface of the P-type emitter region 14 and a cathode electrode 28 is disposed in ohmic contact with all the N-type emitter regions 18 and those portions sandwiched therebetween of the P-type base region 16 to short circuit the extremities of the PN-junctions 24 exposed to the surface of the wafer 10 to one another. A gate electrode 30 is affixed to the P-type base region 16 at its position spaced away from the cathode electrode 28.

In operation a load current can flow across the anode and cathode electrodes 26 and 28 respectively while a control or gating current can be applied to the gate electrode 30 to control the load current. The arrangement illustrated is typically a three-terminal unidirectional switch.

As above described, the extremities of the cathode emitter junctions are short circuited to one another by the cathode electrode mainly for the following reasons: If the thyristor in its forward blocked state increases in temperature a leakage current flowing therethrough will increase. Also an increase in a rise rate (*dv/dt*) of a voltage forward applied across the thyristor is accompanied by an increase in displacement current. Those portions short circuited of the cathode emitter permit the currents thus increased to flow therethrough with the result that the number of injected electrons is restrained from increasing. Further a recovery current occurring upon turning off the thyristor is possible to flow directly from the P-type base region 16 to the cathode electrode 28. This prevents both a decrease in blocking voltage due to an increase in temperature and a decrease in ability to block the voltage while the turnoff time reduces.

However, for the shorted emitter structure, the PN-junction thereof decreases in area of the cathode emitter junction leading to an undesirable increase in the density of current flowing through the thyristor. Also the presence of the short circuited portions obstructs the fired region from laterally spreading which, in turn, causes a local heating of the thyristor for a high rise rate (*di/dt*) of the forward current until the thyristor may damage.

The invention contemplates to provide a new and improved thyristor substantially free from the disadvantages of the shorted emitter-type thyristors as above described and still retaining the advantages thereof as above described.

Referring now to FIGS. 2A and B, wherein like reference numerals designate the components identical to those shown in FIG. 1, there is one embodiment of the invention. By comparing FIG. 2A with FIG. 1 it will be seen that the arrangement of FIG. 2A is similar in construction to that shown in FIG. 1 except for the structure of the cathode emitter junction 24. Referring to the concentrations of impurities doped in the wafer 10 of semiconductive material such as silicon, the intermediate layer or N-type base region 12 has an N-type impurity concentration of about $5\times10^{13}$ atoms per cubic centimeter of the semiconductive material, the outer layer or P-type emitter region 14 has a P-type impurity concentration varying up to about $1\times10^{19}$ atoms per cubic centimeter with an increase in distance from the N-type base region 12, and the outer layer or P-type base region 16 has a P-type impurity concentration varying up to about $1\times10^{17}$ atoms per cubic centimeter as a distance from the N-type base region 12 increases. In other words, the P-type emitter region 14 has a surface concentration of about $1\times10^{19}$ atoms of the P-type impurity per cubic centimeter, and the P-type base region 16 has a surface concentration of about $1\times10^{17}$ atoms of the N-type impurity per cubic centimeter. Similarly the N-type emitter regions 18 has an N-type impurity concentration varying to about $5\times10^{21}$ atoms per cubic centimeter with an increase in distance from the P-type base region 16.

The anode emitter junction 20 formed between the N-type base region 12 and the P-type emitter region 14 and the forward blocking junction 22 formed between the N-type base region 12 and the P-type base region 16 are high in avalanche breakdown voltage and the PN-junctions formed between the P-type base region 16 and the N-type emitter regions 18 can withstand a reverse voltage in the order of from a few volts to some dozen volts.

As best shown in FIG. 2A, a plurality of P-type degenerate regions 32 are disposed in spaced relationship between the P-type base region 16 and the N-type emitter region 18 to form tunnel PN-junctions 34 exhibiting the tunnel effect between the N-type emitter region 18 and the P-type degenerate regions 32. The degenerate region 32 has preferably a P-type impurity concentration of about $5\times10^{18}$ atoms per cubic centimeter or more. FIG. 2B shows a cross section taken in a horizontal plane passing just below the tunnel junctions 32 as viewed in FIG. 2A although a line indicating such a plane is not illustrated in FIG. 2A. In FIG. 2B the cathode emitter region 18 is shown as being in the form of a circular annulus and the degenerate regions 32 are shown as being circular in cross section and uniformly distributed about the center of the annulus.

The cathode electrode 28 in the form of a circular annulus is disposed in ohmic contact with the annular cathode emitter region 18 and the gate electrode 30 is disposed in ohmic contact with the P-type base region 16 at its center rather than on its peripheral portion in the arrangement of FIG. 1 and encircled with the cathode electrode 28. On the other hand, the anode electrode 26 is disposed in ohmic contact with the P-type emitter region 14 as in the arrangement of FIG. 1.

As an example, thyristors such as shown in FIGS. 2A and B was produced in the following manner. A wafer of N-type silicon having an impurity concentration of $5\times10^{13}$ atoms per cubic centimeter was prepared into a disc having a diameter of about 25 mm. and a thickness of 0.500 mm. The wafer was heated in an atmosphere of hydrogen containing gaseous gallium at 1,250° C. for about 80 hours to form P-type layers such as the P-type regions 14 and 16 on the opposite faces thereof. The layers had a surface impurity of about $1\times10^{17}$ atoms of gallium per cubic centimeter and a depth of about 80 microns.

Then a coating of silicon dioxide was formed on both faces of the wafer by thermal oxidation and the coating on one face of the wafer was etched away into a predetermined pattern in the well-known manner for purpose of forming the degenerate regions 32 while the entire coating on the opposite face thereof was similarly etched away.

The wafer thus processed was heated in an atmosphere of nitrogen containing boron to 1,200° C. for about 15 minutes to form discrete diffusion regions highly doped with the P-type impurity or boron on one face of the wafer. Thus the P-type degenerate diffusion regions were formed having a surface concentration of from 1 to $5\times10^{20}$ atoms per cubic centimeter and a depth of from 5 to 10 microns.

The coating or mask was removed with hydrofluoric acid and an N-type degenerate region was formed on that face the wafer provided with the N-type degenerate regions by the epitaxial growth process. To this end, the wafer could be put in a reaction furnace supplied with gaseous hydrogen, silicon tetrachloride and an N-type dopant, phosphine ($PH_3$) and subject to growth in gaseous phase at from 1,150° to 1,200° C. for about 20 minutes. In this way an N-type degenerate region such as shown at 18 in FIG. 2A was formed having a thickness of about 20 microns and an uniform impurity concentration of from 1 to $5\times10^{20}$ atoms of phosphorous per cubic centimeter.

Thereafter the central portion of the N-type region thus formed was etched away by using a mixture of nitric and hydrofluoric acid to form an opening extending into the P-type region such as shown at 16 in FIG. 2A in order to dispose a gate electrode therein.

Then an anode, a cathode and a gate electrodes were disposed on the wafer in the well-known manner.

The thyristor thus formed is somewhat different from that shown in FIGS. 2A and B in that in the former thyristor, the cathode emitter region is coextensive with the one face of the wafer and the gate electrode is disposed within the central opening formed in that region and on the base region with the N-type degenerate region disposed on the other face of the wafer. Also the tunnel junctions 34 are substantially flush with the PN-junction 24.

The operation and effects of the invention will now be described. It will readily be understood that the operation of the invention is similar to that of the prior art type thyristors such as shown in FIG. 1. The invention is characterized in that the cathode emitter junction includes partly the tunnel junctions having the well-known current-to-voltage characteristic as illustrated in FIG. 3 wherein the axis of abscissas represents a voltage applied across the tunnel junction and the axis of ordinates represents a current flowing therethrough.

For a reverse bias the cathode emitter junction 24 is broken down due to the tunnel effect (see curve section *a* in FIG. 3). That is that junction is put in its short-circuited state. This causes the present thyristor to resembled in operation the conventional shorted emitter-type thyristors which, in turn, contributes to a decrease in turnoff time. On the other hand, if the cathode emitter junction is forward biased a tunnel current first flows through the cathode emitter junction 24 as shown at curve section *b* in FIG. 3. When the forward bias increases to exceed the valley voltage $V_v$ (see FIG. 3), a diffusion current flows through the cathode emitter junction to cause the injection of the minority carriers as in semiconductor diodes curve section *c* in FIG. 3.

However, since the cathode emitter junction 24 as shown in FIG. 2A exhibits the tunnel effect, a peak current $I_p$ (see FIG. 3) flows through that junction before the diffusion current as above described begins to flow therethrough. Under these circumstances, it is assumed that with the thyristor put in its forward blocked state, a leakage current flowing through the cathode emitter junction is below the peak current $I_p$. Under the assumed condition, the minority carriers are not injected from the cathode emitter region 18 into the base region 16 with the result that, even with the temperature increased, the blocking voltage is maintained high by the means of the operation similar to that of the conventional shorted emitter-type thyristors. Also even if a forward voltage with a high rise ratio ($dv/dt$) is applied across the present thyristor, a charging current flowing therethrough is forced to flow through the tunnel junctions with the result that the injection of the minority carriers is restrained leading to the prevention of a decrease in forward blocking voltage.

It is assumed that, in order to fire the thyristor, the gate electrode 30 has applied thereto a gating voltage rendering the same positive with respect to the cathode electrode 28 to flow a gating current through the gate electrode. Then the minority carriers is permitted to be injected mainly through the cathode emitter junction 24 to switch the transistor to the conduction across the anode and cathode electrodes thereof.

Experiments were conducted with thyristors similar to the thyristor as shown in FIGS. 2A and B excepting that the cathode emitter junction was entirely formed of a tunnel junction. The results of those experiments indicated that either a gating current for firing the thyristor was much high or the thyristor could not be fired. For this reason, a multiplicity of tunnel junctions 34 with a small area have been uniformly distributed over the cathode emitter region.

At the beginning of the firing period of thyristor caused by the application of a gating current thereto only that portion in the vicinity of the gate electrode of the cathode emitter region is conducting with a limited small area. As time elapses that conducting portion laterally spreads as by the lateral diffusion.

A rate at which the conducting portion spreads is a factor greatly affecting a permissible rise rate of a forward current flowing through the thyristor, that is, a quantity of withstanding (*di/dt*). In shorted emitter-type thyristors of the conventional construction, the cathode emitter region has laterally intermitted. That is, the associated base region includes those portions directly contacted by the cathode electrode. Thus the minority carriers cannot be injected into those portions of the base region whereby the number of the minority carriers required to laterally spread, the conducting portion is lacked to decrease the spreading rate to restrict the quantity of withstanding (*di/dt*).

In contrast the thyristor of the invention includes an unintermitted cathode emitter region put in contact with the cathode electrode alone. This permits the injection of the minority carriers to be effected over the entire cathode emitter region including the tunnel junctions thereby to increase the quantity of withstanding (*di/dt*) as well as forming the conducting region throughout the entire cathode emitter region. It has been found that, as compared with conventional shorted emitter-type thyristors the effective area of the junction has usually increased by the order of from 10 to 30 percent because the cathode electrode has no portion in contact with the adjacent base region.

From the foregoing it will be appreciated that the invention has provided thyristors substantially free from the disadvantages of the shorted emitter-type thyristors of the conventional construction and still retaining the advantages thereof. While the tunnel junctions have preferably the current-to-voltage characteristic as shown in FIG. 3 they may be replaced by PN-junctions formed such that predetermined portions of the cathode emitter junction and the adjacent portions of both regions forming that junction therebetween are highly doped to be degenerated thereby to introduce a multiplicity of centers of recombination thereinto whereby the recombination current substantially flows from the base region to the adjacent cathode emitter region at the level of leakage current therefor while the diffusion current becomes predominant at levels higher than the level of leakage current that is in the conducting state. In the latter case it has been found that on each side of the PN-junction thus formed an impurity concentration is of at least $5\times10^{18}$ atoms per cubic centimeter. Such PN-junctions are; of course, within the scope of the invention.

While the invention has been illustrated and described in conjunction with a few preferred embodiments thereof it is to be understood that various changes and modification may be resorted to without departing from the spirit and scope of the invention. For example the conductivity type of the semiconductor layers or regions may be reversed from that illustrated. Also the tunnel junction or its equivalent may have any desired cross-sectional profile other than a circular profile. Further the invention is equally applicable to bidirectional thyristors. In this case the tunnel junctions or equivalents are disposed in the emitter regions of both thyristor portions.

What is claimed is:

1. A thyristor device comprising, a wafer of semiconductive material including four semiconductive layers of alternate conductivity, a PN-junction formed between the outermost one of said four semiconductive layers providing an emitter region and the adjacent layer providing a base region, at least one degenerate PN-junction forming a part of the first-mentioned PN-junction, and having an ohmic characteristic predominantly dependent upon recombination current at lower levels of current in the order of leakage current and said characteristic predominantly dependent upon diffusion current at higher levels of current in the conductive state, and a gate electrode disposed on said base region to control the current-to-voltage characteristic of the thyristor device.

2. A thyristor device as claimed in claim 1, wherein said base region has an impurity concentration decreasing with an increase in distance from the emitter region adjacent to said base region.

3. A thyristor device as claimed in claim 1, wherein said base region has an impurity concentration decreasing with an increase in distance from an emitter region adjacent to said base region, said base region having a maximum impurity concentration of $1\times10^{17}$ atoms per cubic centimeter.

4. A thyristor device as claimed in claim 1, wherein a plurality of the last-mentioned PN-junctions are disposed in spaced relationship.

5. A thyristor device as claimed in claim 1, wherein the last-mentioned PN-junction has a circular cross section.

6. A thyristor device as claimed in claim 1, wherein a plurality of the last-mentioned PN-junctions are substantially uniformly distributed in spaced relationship on an interface of said emitter and base regions.

* * * * *